(12) United States Patent
Beernink et al.

(10) Patent No.: US 8,168,881 B2
(45) Date of Patent: May 1, 2012

(54) MONOLITHIC PHOTOVOLTAIC MODULE

(75) Inventors: Kevin Beernink, Clarkston, MI (US); Shengzhong Liu, Rochester Hills, MI (US)

(73) Assignee: United Solar Ovonic LLC, Auburn Hills, MI (US)

( * ) Notice: Subject to any disclaimer, the term of this patent is extended or adjusted under 35 U.S.C. 154(b) by 707 days.

(21) Appl. No.: 12/207,014

(22) Filed: Sep. 9, 2008

(65) Prior Publication Data

US 2010/0059098 A1    Mar. 11, 2010

(51) Int. Cl.
*H01L 31/042* (2006.01)
*B05D 5/12* (2006.01)

(52) U.S. Cl. .......................... 136/244; 427/74
(58) Field of Classification Search .................. None
See application file for complete search history.

(56) References Cited

U.S. PATENT DOCUMENTS

| | | | |
|---|---|---|---|
| 4,396,793 A * | 8/1983 | Madan | 136/255 |
| 4,663,829 A * | 5/1987 | Hartman et al. | 438/62 |
| 5,131,954 A * | 7/1992 | Vogeli et al. | 136/244 |
| 5,232,519 A | 8/1993 | Glatfelter et al. | |
| 5,457,057 A | 10/1995 | Nath et al. | |
| 5,468,988 A | 11/1995 | Glatfelter et al. | |
| 5,593,901 A * | 1/1997 | Oswald et al. | 438/80 |
| 6,803,513 B2 | 10/2004 | Beernink et al. | |
| 2008/0314433 A1 * | 12/2008 | Luch | 136/244 |

* cited by examiner

*Primary Examiner* — Alexa Neckel
*Assistant Examiner* — Shannon Gardner
(74) *Attorney, Agent, or Firm* — Gifford, Krass, Sprinkle, Anderson & Citkowski, P.C.

(57) ABSTRACT

A photovoltaic module comprised of a plurality of series connected photovoltaic cells disposed upon a substrate is fabricated utilizing thin film device techniques. A body of photovoltaic stock material comprised of an electrically conductive substrate having at least a bottom electrode layer, a body of photovoltaic material, and a top electrode layer supported thereupon is patterned so as to define a number of individual, electrically isolated photovoltaic cells and a number of electrically isolated connection zones. The connection zones are patterned to each include a portion of the bottom electrode material and are configured so that the bottom electrode material in each segment of the connection zone is exposed, and is in electrical communication with the bottom electrode portion of a particular cell. A current collecting grid structure is disposed on the top electrode of each cell and is placed in electrical communication with the bottom electrode of an adjoining cell via the electrode layer in an appropriate connection zone. In this manner, a series interconnection between the cells is established. Electrical terminals may be affixed to the module, and the finished module may be encapsulated in a body of protective materials. The substrate used in the manufacture of the module may comprise a thin, flexible layer of polymeric material and the disclosed techniques may be utilized to fabricate ultra lightweight photovoltaic modules. Also disclosed are specific module structures.

12 Claims, 6 Drawing Sheets

MONOLITHIC PHOTOVOLTAIC MODULE

FIELD OF THE INVENTION

This invention relates generally to photovoltaic devices. More specifically, it relates to a photovoltaic module comprised of a plurality of individual photovoltaic cells electrically interconnected in a series relationship.

BACKGROUND OF THE INVENTION

Photovoltaic devices represent a renewable, clean, and cost-effective source of electrical power. Hence, photovoltaic devices are finding increasing utility as large scale power sources. A single photovoltaic cell generates power at a relatively low voltage; hence, large area photovoltaic power installations are generally comprised of a plurality of arrays of individual photovoltaic cells interconnected in a series relationship so as to produce a relatively high voltage output. Connection points between individual cells, as well as current-collecting structures such as bus bars, current grids, and the like, can represent a resistive loss in photovoltaic devices, and can also complicate module assembly thereby increasing the cost of such installations.

A number of approaches have been developed in the prior art for manufacture of large scale photovoltaic modules comprised of a number of series connected individual cells. One such approach is disclosed in U.S. Pat. No. 6,803,513, the disclosure of which is incorporated herein by reference.

As will be explained in detail hereinbelow, the present invention is directed to methods for the fabrication of monolithic modules comprised of a number of series interconnected photovoltaic cells supported upon a unitary substrate. The devices and methods of the present invention may be implemented utilizing thin film technology in connection with very large area bodies of photovoltaic stock material. The modules and methods of the present invention minimize the number of connection points and structures utilized in a module and may be readily adapted to the large scale, automated, manufacture of lightweight and ultra lightweight photovoltaic modules. These and other advantages of the invention will be apparent from the drawings, discussion and description which follow.

BRIEF DESCRIPTION OF THE INVENTION

Disclosed herein is a method for the manufacture of a photovoltaic module which includes at least two series interconnected photovoltaic cells. The module is fabricated from a body of photovoltaic stock material which comprises an electrically resistive substrate having a bottom electrode layer of an electrically conductive material supported thereupon, a top electrode layer comprised of an electrically conductive material in a superposed relationship with the bottom electrode layer, and a photovoltaic body interposed therebetween. In particular instances, the stock material may include additional layers. The top electrode layer is patterned by removing portions of its thickness so as to define at least three electrically isolated segments of the top electrode layer. A first segment comprises a first cell top electrode which cooperates with underlying portions of the photovoltaic body and bottom electrode layer to define a first photovoltaic cell. A second segment defines a second cell top electrode which cooperates with underlying portions of the photovoltaic body and the bottom electrode layer to define a second photovoltaic cell, and a third segment overlies a connection zone of the module. A first and a second isolation groove are scribed in the photovoltaic stock material. Each isolation groove extends through the entirety of the top electrode layer, the photovoltaic body, and the bottom electrode layer down to the substrate. The grooves are disposed so as to divide the connection zone into at least three segments which are electrically isolated from one another. Each segment further includes a portion of the bottom electrode layer therein and this portion functions as an electrical contact layer. The portion of the bottom electrode of the first segment is contiguous with, and in electrical communication with, the portion of the bottom electrode layer of the first photovoltaic cell. The portion of the bottom electrode layer of the second segment is contiguous with, and in electrical communication with, the portion of the bottom electrode layer of the second photovoltaic cell. A first current collecting grid structure is disposed upon the first cell top electrode of the first photovoltaic cell. This current collecting grid structure also establishes electrical communication with a portion of the bottom electrode layer of the second segment of the connection zone. A second current collecting grid structure is disposed upon the second cell top electrode of the second photovoltaic cell. The second grid structure also establishes electrical communication with a portion of the bottom electrode layer of the third segment of the connection zone. In this manner, a series electrical connection is established between the first and second photovoltaic cells. In a similar manner, the third and subsequent photovoltaic cells may be incorporated into the string.

The module may be provided with electrical terminals. In this regard, a first module terminal may be disposed so as to be in electrical communication with the bottom electrode of a first photovoltaic cell of the series connected string of cells, and a second module terminal may be disposed so as to be in electrical communication with the top electrode of the last of the series interconnected string of photovoltaic cells. In some instances, the module may be encapsulated with a layer of protective material. In particular instances, the photovoltaic stock material may be configured to include a support body which has the substrate and superjacent layers of the stock material supported thereupon. This support body may be subsequently removed, at least in part, during the course of the fabrication of the module. In particular instances, the support body is comprised of a metal, which may be etched away during the processing of the module.

Also disclosed herein are modules fabricated in accord with this process.

DETAILED DESCRIPTION OF THE INVENTION

The present invention is directed to methods for the manufacture of monolithic photovoltaic modules comprised of two or more individual photovoltaic cells which are electrically interconnected in a series relationship. The method of the present invention provides a method of module fabrication which minimizes electrical interconnections between the individual cells thereby providing for a rugged, simple, easy to fabricate device. The methods of the present invention may be readily adapted to the fabrication of ultra lightweight photovoltaic modules wherein the individual cells and electrical interconnection zones of the module are all disposed upon a unitary lightweight, flexible substrate. The methods of the present invention may be carried out in a variety of embodiments. For purposes of illustration, one specific embodiment of a three-cell module will be described and discussed in detail, and it is to be understood that in view of the teaching presented herein, yet other embodiments and modifications will be apparent to those of skill in the art.

Figure 1:
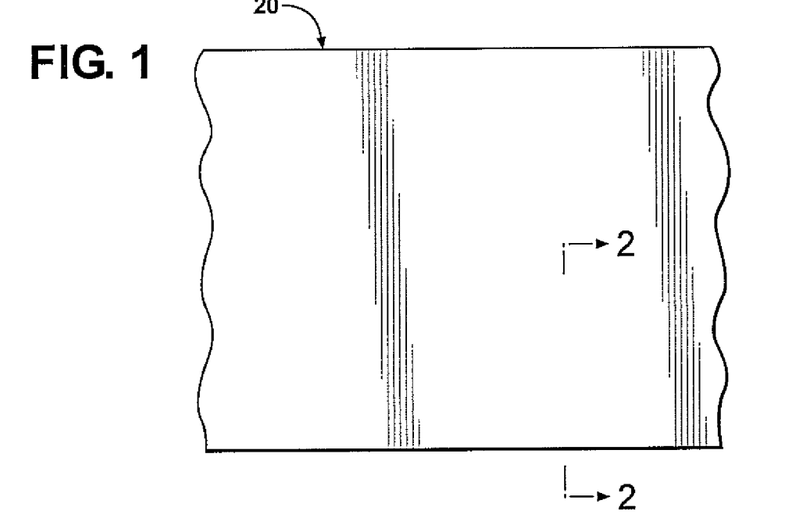
FIG. 1 is a top view of a body of photovoltaic stock material which may be utilized in the practice of the present invention.
Figure 2:
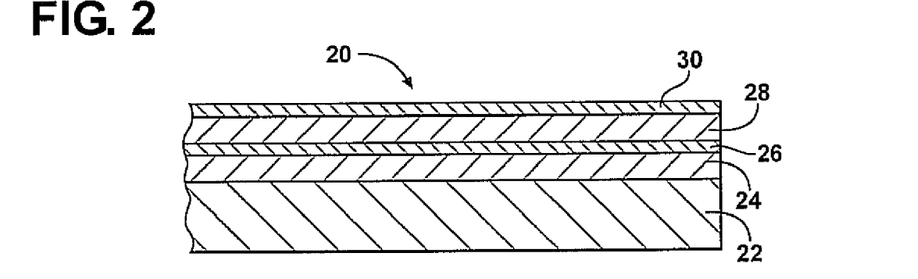
FIG. 2 is a cross-sectional view of the stock material of FIG. 1.

The modules of the present invention may be fabricated from a photovoltaic stock material 20 as is shown in FIG. 1. This material 20 may be fabricated in a high volume, roll-to-roll process and may be cut to particular lengths for use in the fabrication of modules. Referring now to FIG. 2, there is shown a cross-sectional view of the stock material 20 of FIG. 1, taken along line 2-2. In this embodiment, the stock material 20 includes a body of support material 22 which is relatively thick and has good dimensional stability and functions to support and retain the outer layers of the stock material 20 during module fabrication. As will be described hereinbelow, this support body 22 may be wholly or partially removed during the fabrication of the module so as to provide a flexible, lightweight device. In particular instances, the support body 22 is fabricated from a layer of metal, such as a layer of a ferrous alloy, and may be removed by etching with a reactive material such as a solution of ferric chloride. In other instances, support bodies may be comprised of other metals, polymeric materials, glass or ceramic. Depending upon particular applications, the support body may be retained or removed. In some instances, the stock material may not include a support body.

As is further shown in FIG. 2, the stock material 20 includes a body of an electrically insulating substrate material 24 retained upon the support member 22. The substrate material 24 is typically a thin, lightweight material, and one specific substrate material comprises a thin, high-strength polymer having good thermal stability. Typical thicknesses are in the range of 0.5 to 2.0 mil. Such polymers include polyimides such as the material sold under the designation Kapton® by the DuPont corporation. In one particular instance, the substrate comprises a polyimide layer of one mil thickness. It is to be understood that other electrically insulating materials may be used as a substrate in the practice of the present invention. In those instances where a support body 22 is included, the substrate 24 is affixed to the support body as for example by adhesive lamination, thermal lamination or the like.

Disposed upon the substrate 24 is an electrically conductive, bottom electrode layer 26. This layer 26 is fabricated from a material having good electrical conductivity, and will form the base electrode of the photovoltaic devices, as well as connection layers for the module. This layer should have good electrical conductivity and is typically fabricated from a metal, although other materials such as polymers, metal oxides and the like having sufficient electrical conductivity may be employed. In those instances where the photovoltaic module is illuminated from its top surface, this bottom electrode layer may also be made from a highly reflective material so as to function as a back reflector operative to direct unabsorbed light back through the superjacent photovoltaic material. The bottom electrode layer 26 may be a composite body fabricated from a plurality of layers of different materials chosen to combine optimum electrical and optical properties. In one instance, the bottom electrode layer 26 comprises a highly reflective layer of silver having an optical tuning layer of a transparent, electrically conductive material such as zinc oxide thereupon. As is known in the art, this combination of layers may be chosen so as to optimize both electrical conductivity and absorption of light by superjacent semiconductor layers. Such composite back reflectors are shown for example in U.S. Pat. Nos. 5,296,043 and 5,569,332, both of which are incorporated herein by reference.

A photovoltaic body 28 is disposed atop the bottom electrode 26. This photovoltaic body 28 is operative to absorb incident photons and generate carrier pairs in response thereto. There are a variety of photovoltaic materials and configurations which may be utilized to fabricate the photovoltaic body 28. One specific group of materials comprises group IV semiconductor materials, which specifically include hydrogenated alloys of silicon and/or germanium. As is known in the art, such semiconductor materials may be deposited in the form of thin film semiconductor layers. In particular, these materials may be configured to than one or more triads wherein each triad comprises a layer of substantially intrinsic semiconductor material interposed between oppositely doped layers of semiconductor material. In a triad of this type, carrier pairs generated in the substantially intrinsic layer of semiconductor material are separated by an internal field generated by the respective doped layers, so as to create a photovoltaic current. The triads may be stacked in an optical and electrical series relationship to provide a multi junction device as is known in the art. While the invention is being described with reference to one particular class of photovoltaic devices and materials, it is to be understood that the principles of this invention may be implemented in connection with any photovoltaic device and material.

Disposed atop the photovoltaic body 28 is a layer of top electrode material 30. In those instances where the photovoltaic module is to be illuminated through the top surface, this top electrode material 30 is preferably transparent, and as such may comprise a transparent electrically conductive oxide material such as indium tin oxide (ITO) as is known in the art. Other such transparent, electrically conductive materials may likewise be employed, and the invention is not limited to any specific top electrode material. It is to be noted that in these figures, the photovoltaic body 28 is shown as being in direct electrical contact with the bottom electrode layer 26 and the top electrode layer 30; however, in some device configurations, intermediate layers such as current buffering layers, matching layers, and the like may be included; hence, while the photovoltaic body 28 is in electrical communication with the electrode layers 26 and 30, direct electrical contact is not required. In the operation of the module, the photovoltaic body 28, top electrode layer 30, and bottom electrode layer 26 cooperate to provide a photovoltaic cell in which adsorption of light in the photovoltaic body 28 creates and separates carrier pairs which are collected by the electrode layers.

Figure 3:
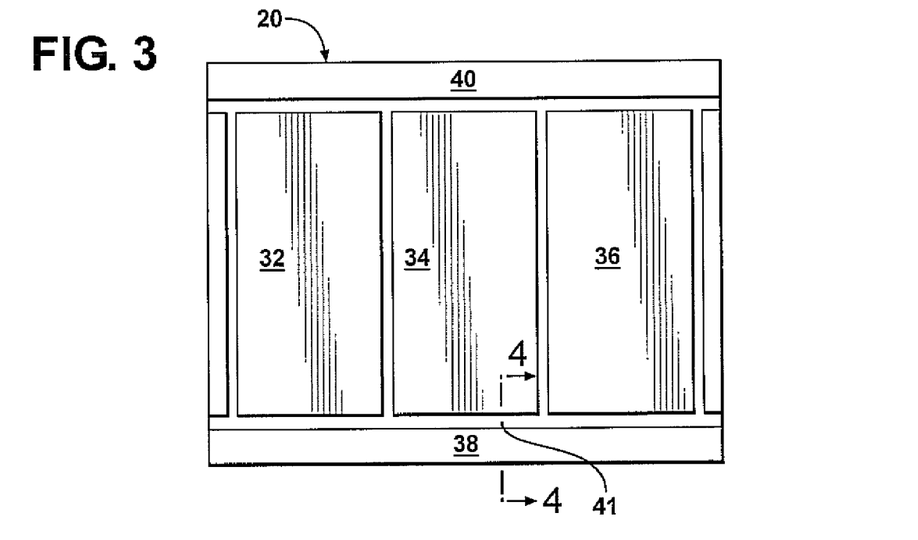
FIG. 3 is a top view of a body of photovoltaic stock material following the patterning of the top electrode.

Referring now to FIG. 3, there is shown a further step in the process for the fabrication of the module. In this step, the top electrode layer of the photovoltaic stock material 20 is patterned by removing portions of its thickness so as to define a number of electrically isolated segments of the top electrode layer. As is shown in these figures, fabrication of a module comprised of three series interconnected photovoltaic cells 32, 34, 36 is depicted; however, it is to be understood that modules comprising a larger number of cells may likewise be fabricated, as may be modules comprised of only two cells. In the process of patterning, the top electrode layer will be divided into a series of electrically isolated segments which are at least one greater than the number of photovoltaic cells. Patterning is accomplished by removing portions of the top electrode layer, and this may be accomplished by etching with a chemical etchant, by laser processes, by resist techniques or the like. In the FIG. 3 embodiment, a module comprised of three photovoltaic cells is shown, and in this particular instance, the top electrode layer is patterned into five distinct, electrically isolated segments. A first segment is associated with a first photovoltaic cell, a second is associated with a second photovoltaic cell and a third is associated with a third photovoltaic cell. In this regard, the first segment comprises a first cell top electrode which cooperates with underlying portions of the photovoltaic body and bottom electrode layer to define the first photovoltaic cell 32. The second segment comprises a second cell top electrode which cooperates with underlying portions of the photovoltaic body and the bottom electrode layer to define the second photovoltaic cell 34, and the third segment comprises a third cell top electrode which cooperates with underlying portions of the photovoltaic body and bottom electrode layer to define the third photovoltaic cell 36. A fourth segment of the patterned top electrode overlies what will become a first connection zone 38 of the finished module and a second segment of the patterned top electrode overlies what will be a second connection zone 40 of the finished module.

Figure 4:
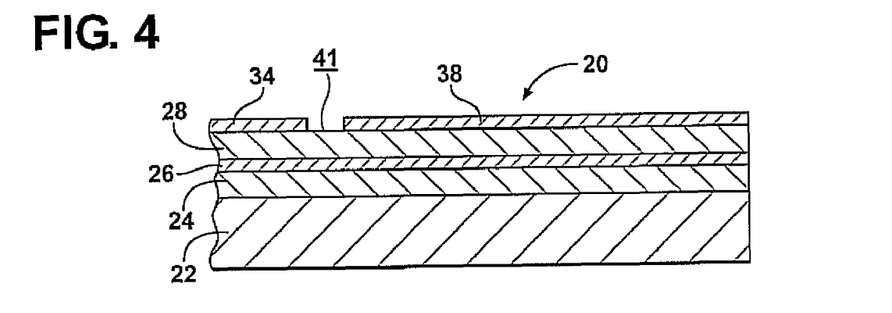
FIG. 4 is a cross-sectional view of the material of FIG. 3 taken along line 4-4.

Referring now to FIG. 4, there is shown a cross-sectional view of the patterned material of FIG. 3 taken along line 4-4. As will be seen, the layer of top electrode material has been patterned by the formation of a patterning groove 41 which passes through the top electrode layer to the photovoltaic body 28. This groove 41 defines the boundary between the second cell 34, top electrode segment and the portion of the top electrode material overlying the first connection zone 38 of the module. At this stage in the processing, the photovoltaic body 28, bottom electrode 26, substrate 24 and support member 22 (if included) are intact.

Figure 5:
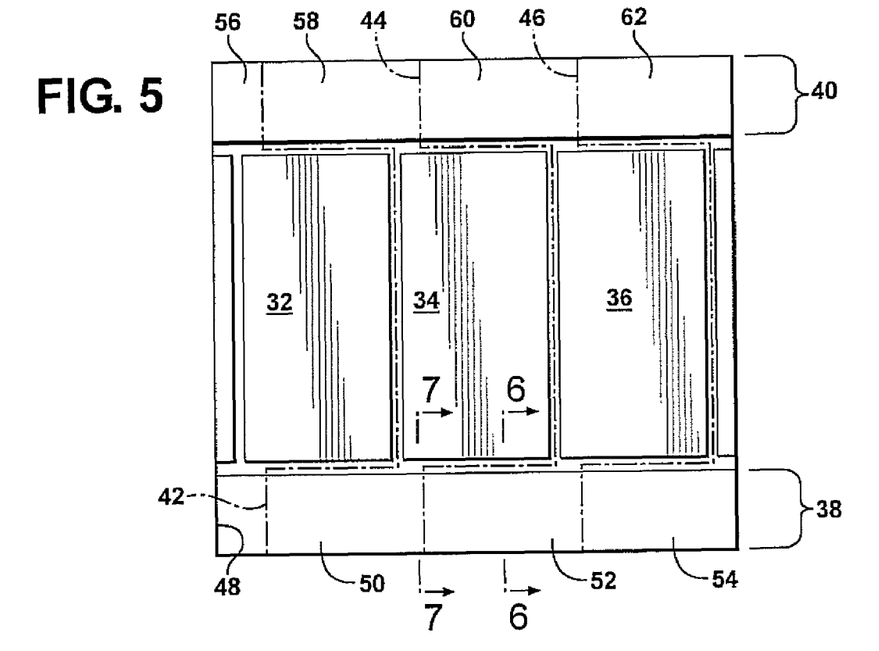
FIG. 5 is a top view of the stock material of FIG. 3 at a further stage in processing.

Referring now to FIG. 5, there is shown a further step in the processing of the module. In this step, a series of isolation grooves are scribed into the photovoltaic stock material. Each isolation groove extends through the top electrode layer, the photovoltaic body and the bottom electrode layer, to the substrate. In general, the number of isolation grooves will be equal to the number of photovoltaic cells comprising the module. Formation of the grooves may be by various etching processes known in the semiconductor arts and these include chemical etching, laser scribing, water jet scribing, resist techniques and the like. In the illustration of FIG. 5, three isolation grooves 42, 44 and 46 as illustrated by dotted lines are formed in the stock material. The grooves are configured so as to divide the photovoltaic body and underlying portions of the bottom electrode layer into electrically isolated segments. The grooves are further positioned so as to divide the connection zone of the module into a plurality of electrically isolated segments such that the number of segments will be at least one larger than the number of photovoltaic cells in the module. As illustrated in FIG. 5, the lower connection zone 38 is divided into a first segment 48, a second segment 50, a third segment 52 and a fourth segment 54. Likewise the upper connection zone 40 is divided into four segments, 56, 58, 60 and 62. Each segment of the connection zone will include a portion of the bottom electrode layer, and these portions are electrically isolated from one another and each segment thus includes a contact layer, as defined by its associated portion of the bottom electrode layer. As described below, these contact layers are utilized to form the series interconnections between the photovoltaic cells.

Figure 6:
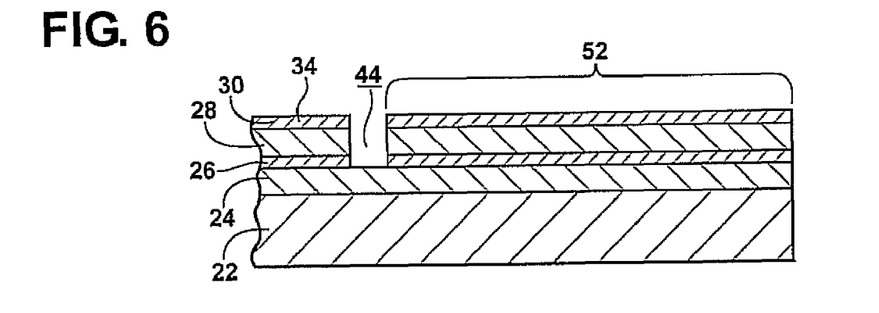
FIG. 6 is a cross-sectional view of the material of FIG. 5 taken along line 6-6.

Referring now to FIG. 6, there is shown a cross-sectional view of the material of FIG. 5 taken along line 6-6. As will be seen, an isolation groove 44 extends through the top electrode layer 30 (which has previously been patterned in the step illustrated in FIGS. 3-4) through the photovoltaic body 28 and through the bottom electrode 26 so as to expose a portion of the substrate 24. In this manner, the layers in the third segment 52, of the connection zone 38, are electrically isolated from the second photovoltaic cell 34.

Figure 7:
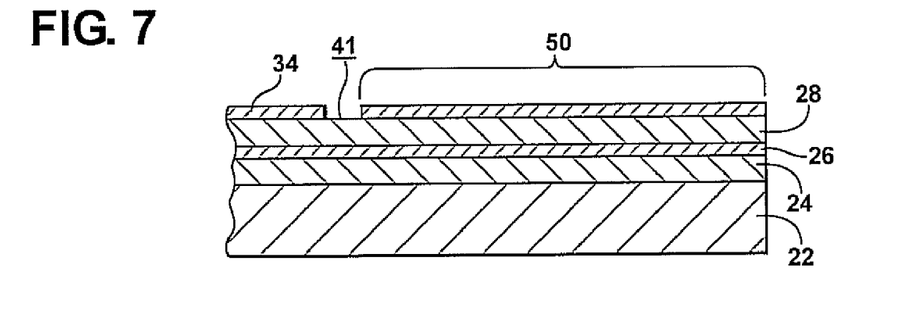
FIG. 7 is a cross-sectional view of the material of FIG. 5 taken along line 7-7.

Referring now to FIG. 7, there is shown a cross-sectional view of the material of FIG. 5 taken along line 7-7. As such, this structure is generally similar to that shown in FIG. 4 insofar as the patterning groove 41 has isolated the top electrode of the second cell 34 from the portion of the top electrode material of second segment 50 of connection zone 38. It will be noted that the bottom electrode layer 26 extends from the second cell 34 through to the second segment 50 of the connection zone 38 and as such establishes electrical communication therebetween. Likewise, the bottom electrode 26 of the first cell 32 will be in electrical communication with the bottom electrode 26 of the first segment 48, and the bottom electrode 26 of the third cell 36 will be in electrical communication with the bottom electrode layer 26 of the third segment 52. In the illustrated embodiment, the bottom electrode portion of the fourth segment 54 is not in electrical communication with the bottom electrode layer 26 of the three cells 32, 34 and 36.

In the illustration of FIG. 5, the module includes two connection zones 38 and 40. As noted previously, this is optional; only one connection zone need be included. However, if a second connection zone is included, the interrelationship of the cells and bottom electrodes of the segments of the connection zone are similar as previously described. That is to say, the bottom electrode of the first cell 32 is in electrical communication with the bottom electrode portion of the first segment 56 of the upper or second connection zone 40; the bottom electrode of the second cell 34 is in electrical communication with the bottom electrode portion of the second segment 58, and the bottom electrode portion of the third cell 36 is in electrical communication with the bottom electrode portion of the second segment 60 of the second connection zone.

Figure 8:
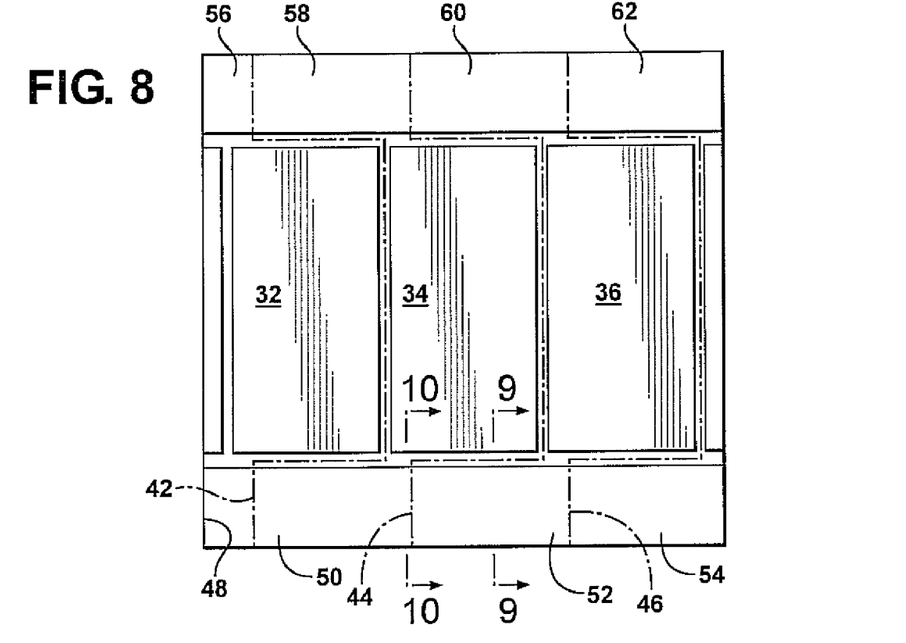
FIG. 8 is a top view of the stock material of FIG. 5 at a further stage of processing.
Figure 9:
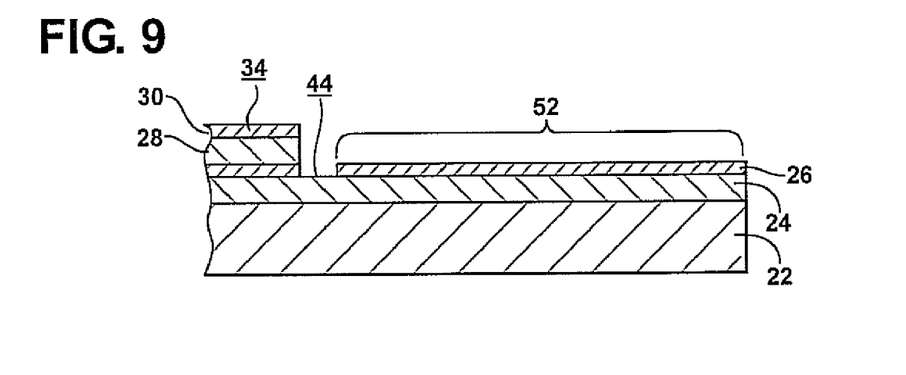
FIG. 9 is a cross-sectional view of the material of FIG. 8 taken along line 9-9.
Figure 10:
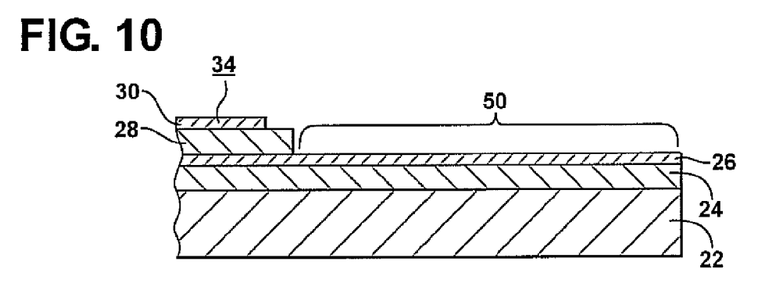
FIG. 10 is a cross-sectional view of the material of FIG. 8 taken along line 10-10.

In a further processing step as is shown in FIGS. 8-10, portions of the top electrode layer and semiconductor body overlying the various segments of the connection zones are removed. In this regard, FIG. 9 shows a cross-sectional view of the material of FIG. 8 taken along lines 9-9 and as will be seen, a segment of the bottom electrode layer 26 is exposed upon the surface of the third segment 52 of connection zone 38. This segment is electrically isolated from the photovoltaic body 28 and the bottom electrode 26 of the second photovoltaic cell 34 by the isolation groove 44.

As is seen in FIG. 10, which is a cross-sectional view of the material of FIG. 8 taken along line 10-10, the bottom electrode 26 associated with the second segment 50 of the connection zone 38, is in electrical communication with the photovoltaic body 28 of the second photovoltaic cell 34. In this manner, this exposed portion of the bottom electrode 26 allows for electrical communication to be made directly to the bottom electrode of the second cell 34. Again, this step of exposing the bottom electrode layer may be accomplished by techniques well known in the art including chemical etching techniques, laser etching techniques, resist techniques and the like.

Figure 11:
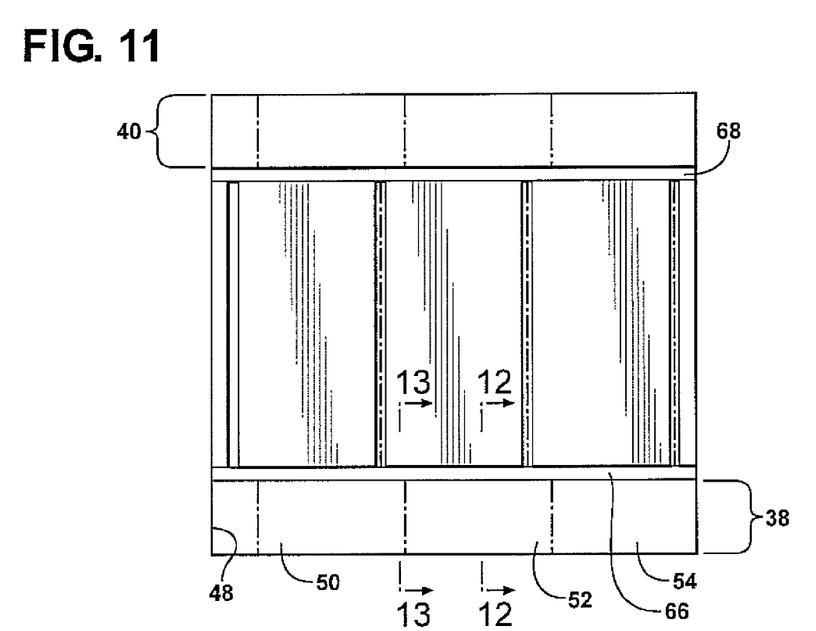
FIG. 11 is a top view of a body of material of FIG. 8 at a further stage in its processing.
Figure 12:
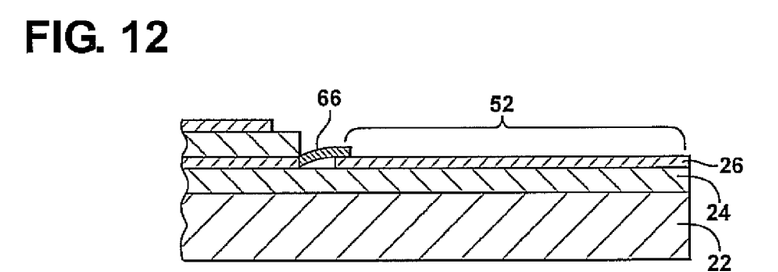
FIG. 12 is a cross-sectional view of the material of FIG. 11 taken along line 12-12.
Figure 13:
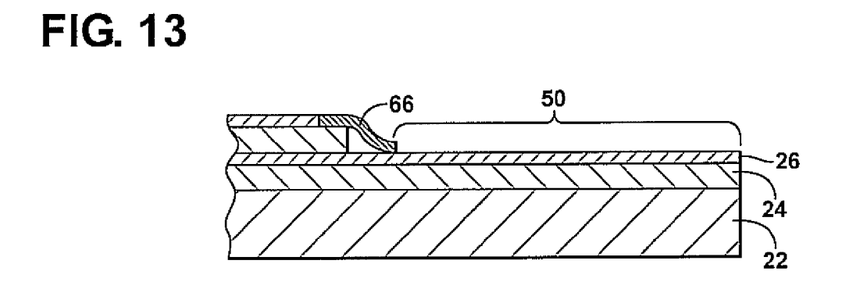
FIG. 13 is a cross-sectional view of the material of FIG. 11 taken along line 13-13.

In a subsequent step as is illustrated in FIGS. 11-13, an electrically insulating tape 66 is placed along the edges that adjoin the connection zones and the photovoltaic cells. As illustrated, a tape 66 is placed between the lower connection zone 38 and cells 32, 34 and 36. A similar insulating tape 68 is placed between the second connection zone 40 and the cells 32, 34 and 36. A cross-sectional view of the material of FIG. 11 taken along 12-12 is shown in FIG. 12, and a similar cross-sectional view taken along line 13-13 is shown in FIG. 13. These views illustrate the placement of the tape 66. The tape 66 may comprise a self-adherent electrically insulating tape such as a polymeric tape. Also it is to be noted that while the material is referred to as a tape, a similar insulating function may be achieved by coating a layer of electrically resistive material, such as a polymeric solution, a hot melt compound or the like.

Figure 14:
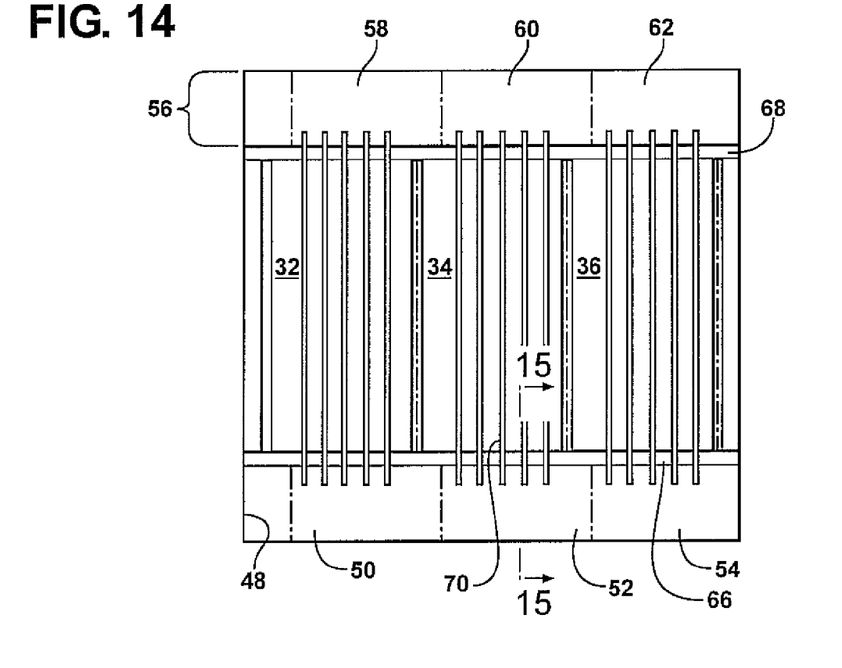
FIG. 14 is a top view of the material of FIG. 8 at a further stage in its processing.
Figure 15:
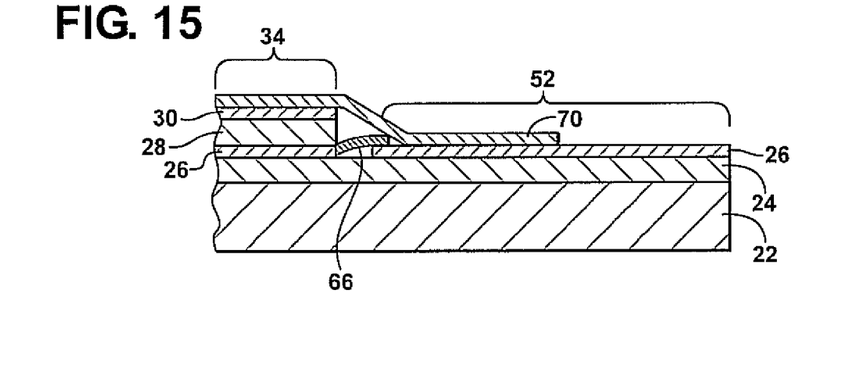
FIG. 15 is a cross-sectional view of the material of FIG. 14 taken along line 15-15.

In a further step of the invention, as is illustrated in FIGS. 14 and 15, a current collecting grid structure is affixed to the top electrode layer 30 of each of the photovoltaic cells. This grid structure may comprise a plurality of individual current collecting wires or it may comprise a single patterned body of high electrical conductivity such as a metal. The purpose of the grid, as is known in the art, is to provide a low resistance path for collecting electrical current from the top electrode layer (which typically has a relatively high electrical resistance) and carry this current to a collection point such as a bus bar, terminal or the like. In the illustration of FIG. 14, the grid structure is illustrated as comprising a plurality of grid wires. The grid wires are formed from an electrically conductive material and may, optionally, have a coating disposed thereupon. As shown, the grid structure is disposed so as to extend to the connection zone such that the grid which is in electrical communication with the top electrode layer of one cell will be electrically connected to the portion of the bottom electrode layer of the connection zone which is in electrical communication with the bottom electrode of the adjacent cell.

As will be seen in FIG. 15, which is a cross-sectional view of the device of FIG. 14 taken along line 15-15, the top electrode layer 30 of the second photovoltaic cell 34 is electrically connected to the portion of bottom electrode material 26 of the third segment 52, and as explained above, this segment 52 also establishes electrical communication with the bottom electrode of the third cell 36. In this manner, a series electrical connection is established between the second cell 34 and the third cell 36. Likewise, the top electrode layer of the first cell 32 is electrically connected to the bottom electrode portion of the second segment 50 which in turn is in electrical communication with the bottom electrode of the second cell 34. Similar connections are established through the segments 56, 58, 60 and 62 of the upper connection zone 40. It will be appreciated that this process may be extended for the fabrication of series connected modules of a larger or smaller number of individual cells.

Figure 16:
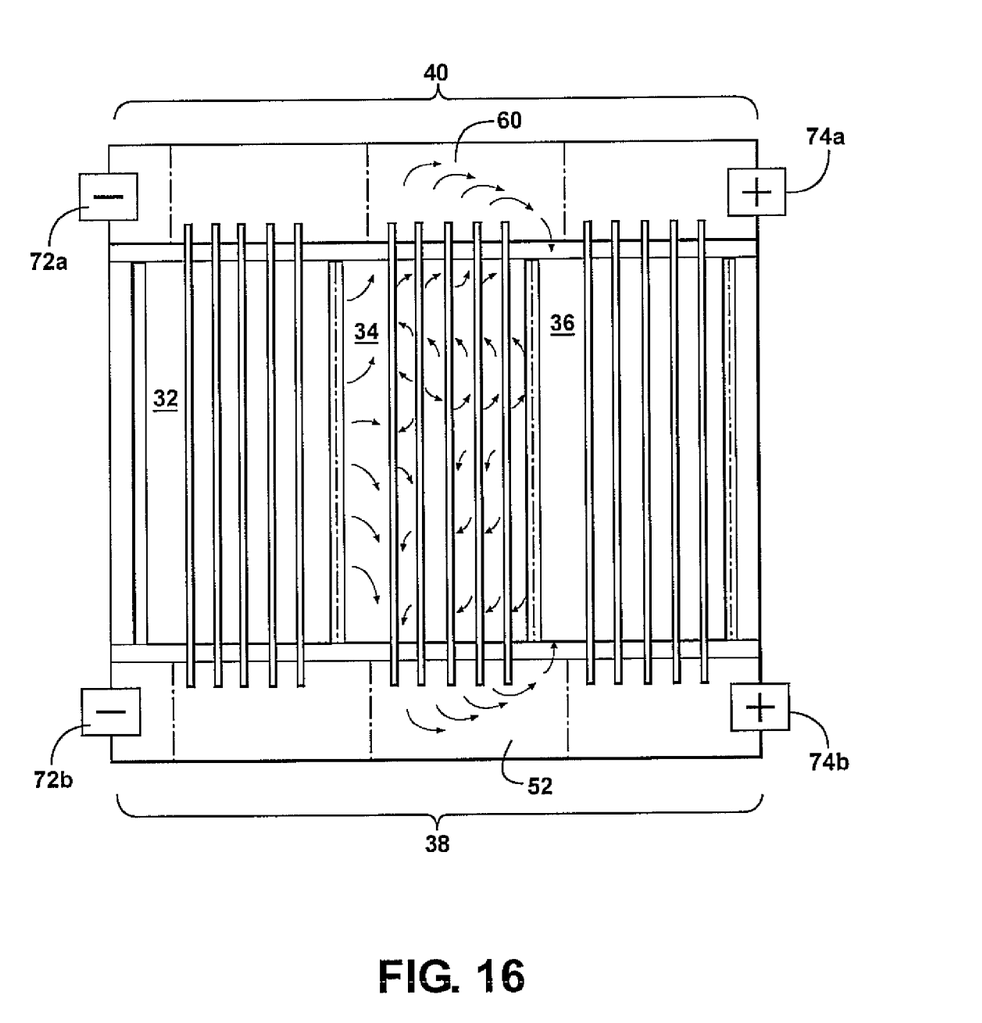
FIG. 16 is a top view of a finished, series interconnected photovoltaic module illustrating the flow of electrical current through one of the cells thereof.

Referring now to FIG. 16, there is shown a finished version of this particular embodiment of module. As will be seen, a first set of module terminals 72a, 72b are affixed to the electrode portion of the first segments of the two connection zones 38, 40, and a second set of module terminals 74A and 74B are affixed to the fourth segments of the two connection zones 38, 40. Current flow in the second cell 34 is illustrated by a series of arrows, and it will be seen that current flows through the top electrode layer of the cell 34 through to the grid structure, and from thence is conveyed to the electrode material of the third segments 52 and 60, and from thence is conveyed to the bottom electrode of the third cell 36. A similar current flow occurs between the top electrode of the first cell 32, and the bottom electrode of the second cell 34.

As is known in the art, the module may be encapsulated in or coated with a protective material such as a fluoropolymer or silicone polymer material. Also, the support body 22 may be removed from the module once fabrication is completed so as to reduce its weight. As discussed above, the support body may comprise a metal which is subsequently etched away. For example, the substrate may be supported upon a sheet of steel which can be removed by acid etching. In other instances, the support may be removed by skiving techniques, milling techniques or the like.

The foregoing describes the general principles of this invention. As noted above, one of skill in the art could readily adapt the invention to fabricate modules which include series connected modules having other configurations. All of such embodiments are within the scope of this invention. The foregoing drawings, discussion and description are illustrative of some specific embodiments of the invention, but are not meant to be limitations upon the practice thereof. It is the following claims, including all equivalents, which define the scope of the invention.

The invention claimed is:

1. A method for the manufacture of a photovoltaic module which includes at least two series-interconnected photovoltaic cells, said method comprising in order the steps of:

providing a body of photovoltaic stock material, said stock material comprising an electrically resistive substrate, a bottom electrode layer comprised of a body of electrically conductive material supported on said substrate, a top electrode layer comprised of an electrically conductive material in a superposed relationship with said bottom electrode layer so that said bottom electrode layer is closer to said substrate than is said top electrode layer, and a photovoltaic body interposed between said bottom electrode layer and said top electrode layer;

patterning the top electrode layer of said photovoltaic stock material by removing portions of the thickness thereof so as to define three electrically isolated segments of said top electrode layer, a first segment comprising a first cell top electrode which cooperates with underlying portions of the photovoltaic body and bottom electrode layer to define a first photovoltaic cell, a second segment defining a second cell top electrode which cooperates with underlying portions of the photovoltaic body and the bottom electrode layer to define a second photovoltaic cell, and the third segment overlying a connection zone of said module;

scribing a first and a second isolation groove in said photovoltaic stock material, each isolation groove extending through the top electrode layer, the photovoltaic body, and the bottom electrode layer thereof to the substrate, said grooves being disposed so as to divide the connection zone into three segments which are electrically isolated from one another, each segment further including a portion of said bottom electrode layer, wherein said portion of the bottom electrode layer of the first segment is contiguous with, and in electrical communication with, the portion of the bottom electrode layer of the first photovoltaic cell and the said portion of the bottom electrode layer of the second segment is contiguous with, and in electrical communication with, the portion of the bottom electrode layer of the second photovoltaic cell;

disposing a first current collecting grid structure upon the first cell top electrode of said first photovoltaic cell, said first current collecting grid structure also establishing electrical communication with the portion of the bottom electrode layer of the second segment of said connection zone;

disposing a second current collecting grid structure upon the second cell top electrode of the second photovoltaic cell, said second grid structure also establishing electrical communication with the portion of the bottom electrode layer of the third segment of said connection zone; whereby there is established a series connected string comprised of said first and said second photovoltaic cells.

2. The method of claim 1, including the further step of providing a first module terminal which is in electrical communication with the bottom electrode of said first photovoltaic cell, and providing a second module terminal which is in electrical communication with the top electrode of said second photovoltaic cell.

3. The method of claim 1 wherein the step of patterning the top electrode layer further comprises patterning the top electrode layer by removing portions of the thickness thereof so as to define a fourth segment which is electrically isolated from the first, the second and the third segments, said fourth segment comprising a third cell top electrode layer which cooperates with underlying portions of the photovoltaic body and the bottom electrode layer to define a third photovoltaic cell; and wherein the step of scribing a first, and a second isolation groove further includes the step of scribing a third isolation groove which extends through the top layer, the photovoltaic layer and the bottom electrode layer to the substrate, and wherein said isolation groove cooperates with said first and second isolation grooves to divide the connection zone into four segments which are electrically isolated from one another and wherein said fourth segment includes a portion of said bottom electrode layer wherein said portion of the bottom electrode layer of the fourth segment is contiguous with, and in electrical communication with, the portions of the bottom electrode layer of the third photovoltaic cell; and said method further including the step of disposing a third current collecting grid structure upon the third cell top electrode of said third photovoltaic cell, said third current collecting grid structure also establishing electrical communication with the portion of the bottom electrode layer of the fourth segment of said connection zone; whereby there is established a series connected string of said first, second and third photovoltaic cells.

4. The method of claim 1, wherein said substrate of said photovoltaic stock material comprises a polymeric material.

5. The method of claim 1, wherein the substrate of said photovoltaic stock material is retained upon a support body during at least some of the recited processing steps.

6. The method of claim 5, including the further step of removing at least a portion of said support body from said substrate.

7. The method of claim 6, wherein said support body comprises a metal, and the step of removing at least a portion of said support body comprises etching said metal away from said support body.

8. The method of claim 1, including the further step of coating at least one surface of said photovoltaic module with an encapsulate material.

9. The method of claim 1, wherein said photovoltaic body includes at least one layer of a thin film photovoltaic material.

10. The method of claim 9, wherein said thin film photovoltaic material is comprised of a hydrogenated alloy layer of silicon and/or germanium.

11. The method of claim 1, wherein said bottom electrode layer is a composite layer comprised of a first sub-layer of a first electrically conductive material and a second sub-layer of a second electrically conductive material, said sub-layers being disposed in a stacked relationship.

12. The method of claim 1, wherein said top electrode is comprised of a transparent, electrically conductive material.

* * * * *